(12) United States Patent
Terada

(10) Patent No.: US 8,664,110 B2
(45) Date of Patent: Mar. 4, 2014

(54) METHOD FOR FORMING SEMICONDUCTOR DEVICE

(76) Inventor: Shinobu Terada, Tokyo (JP)

(*) Notice: Subject to any disclaimer, the term of this patent is extended or adjusted under 35 U.S.C. 154(b) by 0 days.

(21) Appl. No.: 13/359,061

(22) Filed: Jan. 26, 2012

(65) Prior Publication Data

US 2012/0196435 A1    Aug. 2, 2012

(30) Foreign Application Priority Data

Jan. 27, 2011   (JP) .................................. 2011-015139

(51) Int. Cl.
   *H01L 21/4763*   (2006.01)
(52) U.S. Cl.
   USPC ......................................... 438/627; 438/625
(58) Field of Classification Search
   USPC ....................................................... 438/627
   See application file for complete search history.

(56) References Cited

U.S. PATENT DOCUMENTS

| | | | | |
|---|---|---|---|---|
| 2004/0214446 A1* | 10/2004 | Kim et al. | | 438/706 |
| 2005/0020057 A1* | 1/2005 | Kudo et al. | | 438/638 |
| 2007/0105362 A1* | 5/2007 | Kim et al. | | 438/618 |
| 2008/0211098 A1* | 9/2008 | Suzuki et al. | | 257/751 |
| 2008/0296633 A1* | 12/2008 | Adams et al. | | 257/255 |
| 2008/0318409 A1* | 12/2008 | Sakata | | 438/623 |
| 2010/0178771 A1* | 7/2010 | Oh et al. | | 438/700 |

FOREIGN PATENT DOCUMENTS

JP    2007-134717    5/2007

\* cited by examiner

*Primary Examiner* — Charles Garber
*Assistant Examiner* — Brigitte Paterson
(74) *Attorney, Agent, or Firm* — Young & Thompson

(57) ABSTRACT

A method of forming a semiconductor device includes, but is not limited to, the following processes. A first interlayer insulating film is formed. A hole is formed in the first interlayer insulating film. A second interlayer insulating film is formed, which buries the hole and covers the first interlayer insulating film. An interconnect groove is formed by selectively etching the second interlayer insulating film to leave the second interlayer insulating film in the hole. The second interlayer insulating film in the hole is removed.

20 Claims, 15 Drawing Sheets

METHOD FOR FORMING SEMICONDUCTOR DEVICE

BACKGROUND OF THE INVENTION

1. Field of the Invention

The disclosure relates to a method for forming a semiconductor device.

Priority is claimed on Japanese Patent Application No. 2011-015139, filed Jan. 27, 2011, the content of which is incorporated herein by reference.

2. Description of the Related Art

The dual-damascene method, whereby an interconnect and a contact plug are formed simultaneously, has been used as a method for manufacturing a semiconductor device in the related art.

In the dual-damascene method, first a first interlayer insulating film, an etching stopper film, and a second interlayer insulating film are sequentially laminated over an interconnect. Next, a contact hole is formed that passes through the first interlayer insulating film, the etching stopper film, and the second interlayer insulating film, and that also exposes the upper surface of the interconnect.

Next, an interconnect formation trench is formed integrally with the contact hole on the second interlayer insulating film. Then, a barrier layer is formed that covers the inner surface of the contact hole and the interconnect formation trench, after which a metal such as copper (Cu) or the like is buried into the contact hole and the interconnect formation trench, so as to form the interconnect and the contact plug simultaneously.

In the above-noted dual-damascene method, it is preferable that the contact hole be formed first and then the interconnect formation trench be formed, using the via-first method. These are disclosed in Japanese Patent Application Publication No. JPA 2007-134717.

SUMMARY

In one embodiment, a method of forming a semiconductor device may include, but is not limited to, forming a first interlayer insulating film; forming a hole in the first interlayer insulating film; forming a second interlayer insulating film which buries the hole and covers the first interlayer insulating film; forming an interconnect groove by selectively etching the second interlayer insulating film to leave the second interlayer insulating film in the hole; and selectively removing the second interlayer insulating film in the hole.

BRIEF DESCRIPTION OF THE DRAWINGS

The above features and advantages of the disclosures will be more apparent from the following description of certain preferred embodiments taken in conjunction with the accompanying drawings, in which.

DETAILED DESCRIPTION OF THE PREFERRED EMBODIMENTS

Before describing embodiments of the present invention, the related art will be explained in detail with reference to FIG. 10 to FIG. 16, in order to facilitate the understanding of embodiments of the present invention.

FIG. 10 to FIG. 15 are cross-sectional views that show the process steps for manufacturing an interconnect and a contact plug using a via-first dual-damascene method in the related art. FIG. 16 is a cross-sectional view for illustrating the via-first dual-damascene method in the related art.

The method for manufacturing an interconnect and a contact plug using the via-first dual-damascene method in the related art will be described, with references made to FIG. 10 to FIG. 15, followed by describing the via-first dual-damascene method in the related art, with references to FIG. 16.

Figure 10:
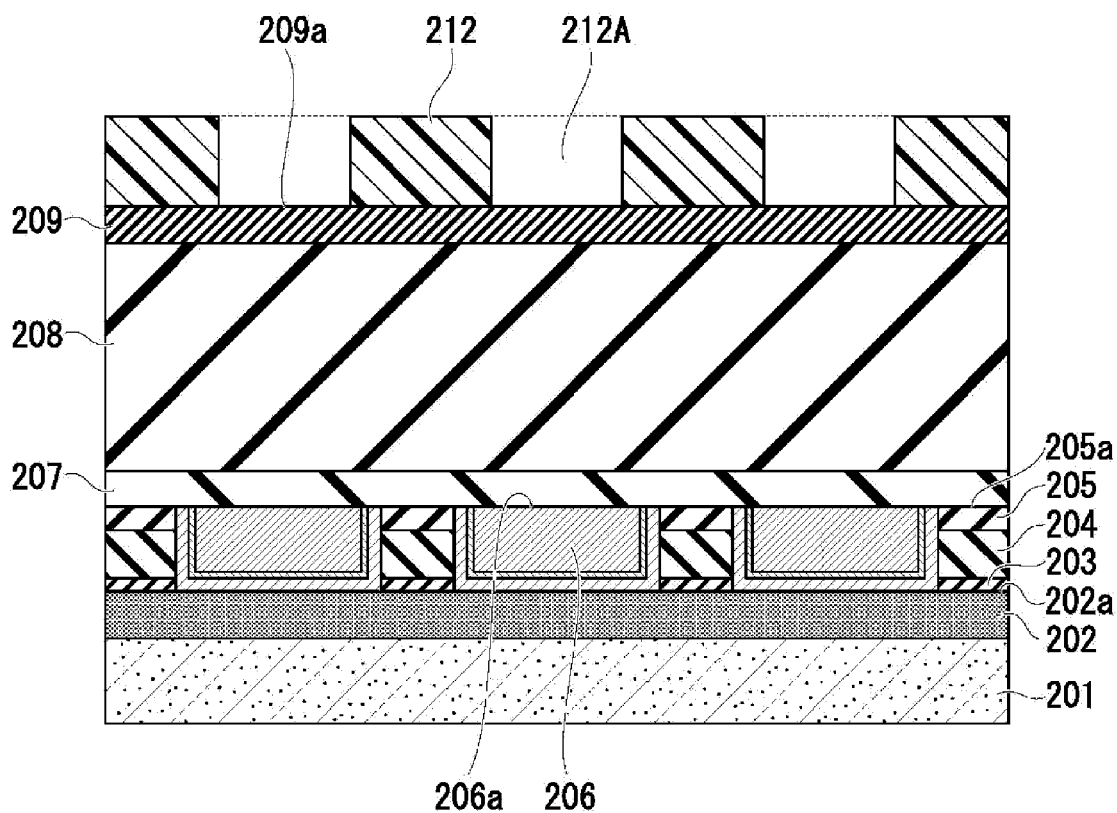
FIG. 10 is a fragmentary cross sectional elevation view of a step involved in a method of forming a semiconductor device in accordance with the related art.

In the process step shown in FIG. 10, an interlayer insulating film 202 is formed on a semiconductor substrate 201. Next, an anti-diffusion film 203, an interlayer insulating film 204, and a protective film 205 are sequentially formed on the upper surface 202a of the interlayer insulating film 202.

Specifically, a silicon carbonitride film (SiCN film) having a thickness of approximately 30 nm is formed as the anti-diffusion film 203. Next, a silicon oxycarbide film (SiOC film, which is a low dielectric constant film having a thickness of approximately 110 nm, is formed as the interlayer insulating film 204, after which a silicon oxide film ($SiO_2$ film) having a thickness of approximately 50 nm is formed as the protective film 205.

Next, using the single-damascene method, a first interconnect 206 made of copper (Cu) is formed on the anti-diffusion film 203, the interlayer insulating film 204, and the protective film 205. By doing this, the upper surface 206a of the first interconnect 206 is substantially flush with the upper surface 205a of the protective film 205.

Next, a silicon carbonitride film (SiCN film) having a thickness of approximately 80 nm is formed as an anti-diffusion film 207 so as to cover the upper surface 205a of the protective film 205, and the upper surface 206a of the first interconnect 206.

Next, on the anti-diffusion film 207, a silicon oxycarbide film (SiOC film) having a thickness of 600 nm is formed as an interlayer insulating film 208 and a silicon oxide film ($SiO_2$ film) having a thickness of 180 nm is sequentially formed as a protective film 209. The protective film 209 is a film that prevents damage to a silicon oxycarbide film (SiOC film) that has a low dielectric constant and a weak mechanical strength.

Next, photolithography is used to form over the protective film 209 a first resist mask 212 having an aperture part 212A that exposes the upper surface 209a of the protective film 209 opposite a contact hole formation region.

Figure 11:
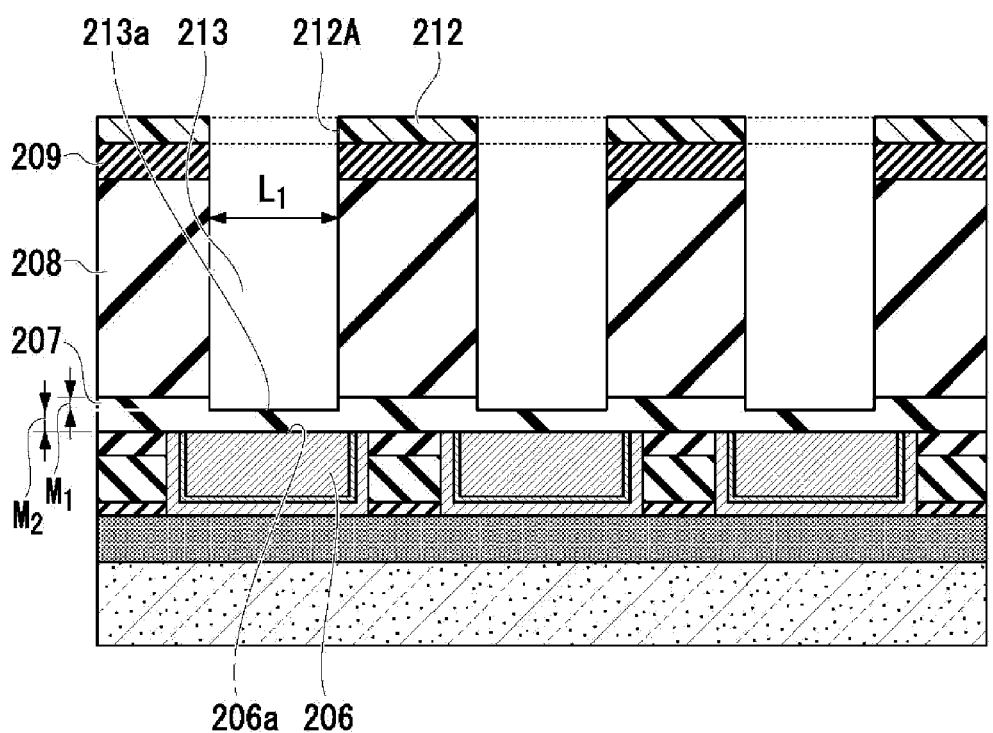
FIG. 11 is a fragmentary cross sectional elevation view of a step, subsequent to the step of FIG. 10, involved in a method of forming a semiconductor device in accordance with the related art.

Next, in the process step shown in FIG. 11, by dry etching using the first resist mask 212 as a mask, the interlayer insulating film 208 and the protective film 209 are etched, so as to form a hole 213 that has a bottom surface 213a that exposes the anti-diffusion film 207 and also has a depth that does not reach the first interconnect 206.

By causing the anti-diffusion film 207 to remain at the bottom surface 213a of the hole 213 in this manner, it is possible to prevent the oxidation of the upper surface 206a of the first interconnect 206, which is made of copper (Cu) when the semiconductor device is manufactured.

When this is done, the diameter $L_1$ of the hole 213 is made 180 nm, the thickness of the etching $M_1$ (amount of etching) of the anti-diffusion film 207 is made 30 nm, and the thickness $M_2$ of the anti-diffusion film 207 that is caused to remain at the bottom of the hole 213 (residual film) is made 50 nm.

Figure 12:
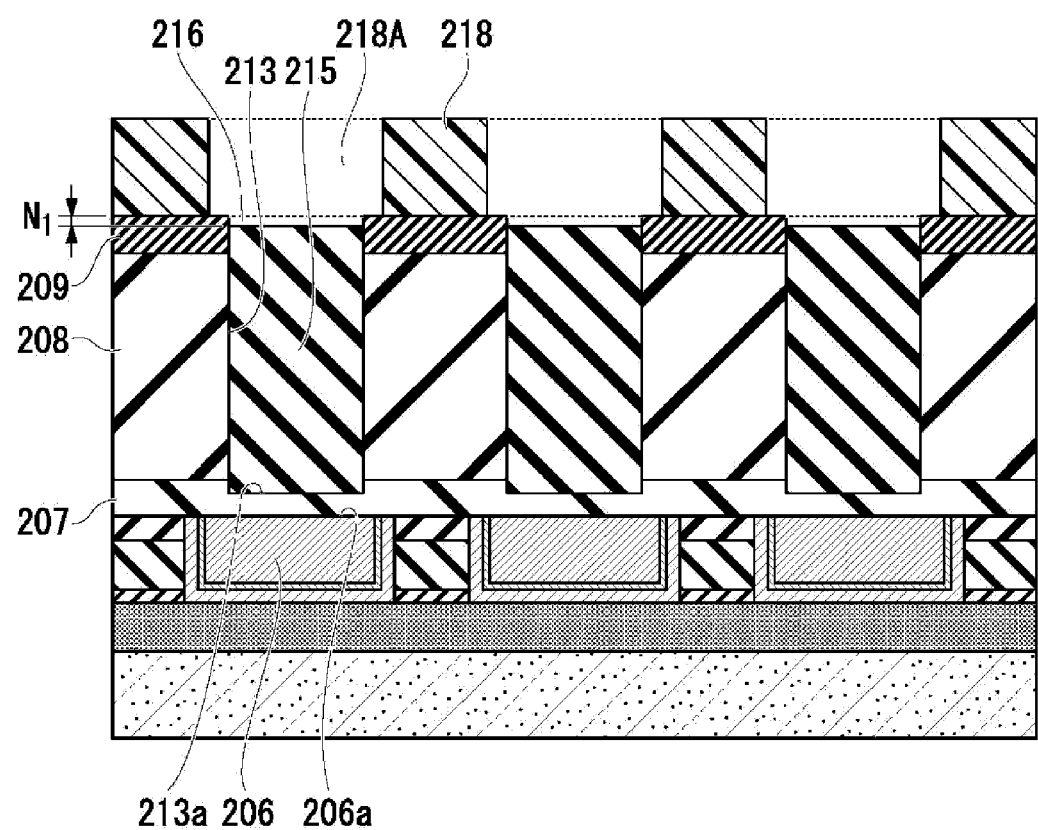
FIG. 12 is a fragmentary cross sectional elevation view of a step, subsequent to the step of FIG. 11, involved in a method of forming a semiconductor device in accordance with the related art.

Next, in the process step shown in FIG. 12, by performing plasma ashing using oxygen as an ashing gas, the first resist mask 212 shown in FIG. 11 is removed. Then, a BARC (bottom anti-reflection coating) having a thickness of approximately 560 nm is formed so as to bury the hole 213, using spin coating.

After that, etching is done so as to remove the BARC formed over the protective film 209 and so that the BARC remains inside the hole 213. By doing this, a buried insulating film 215 made of a BARC is formed inside the hole 213.

In order to remote the BARC completely from over the protective film 209, the processing time for the above-noted etching back is made longish. By doing this, a recess 216 is formed on the buried insulating film 215. The recess amount $N_1$ is approximately 50 nm.

Next, on the protective film 209, photolithography is used to form a second resist mask 218 having a trench-shaped aperture part 218A that exposes the upper surface of the buried insulating film 215.

Figure 13:
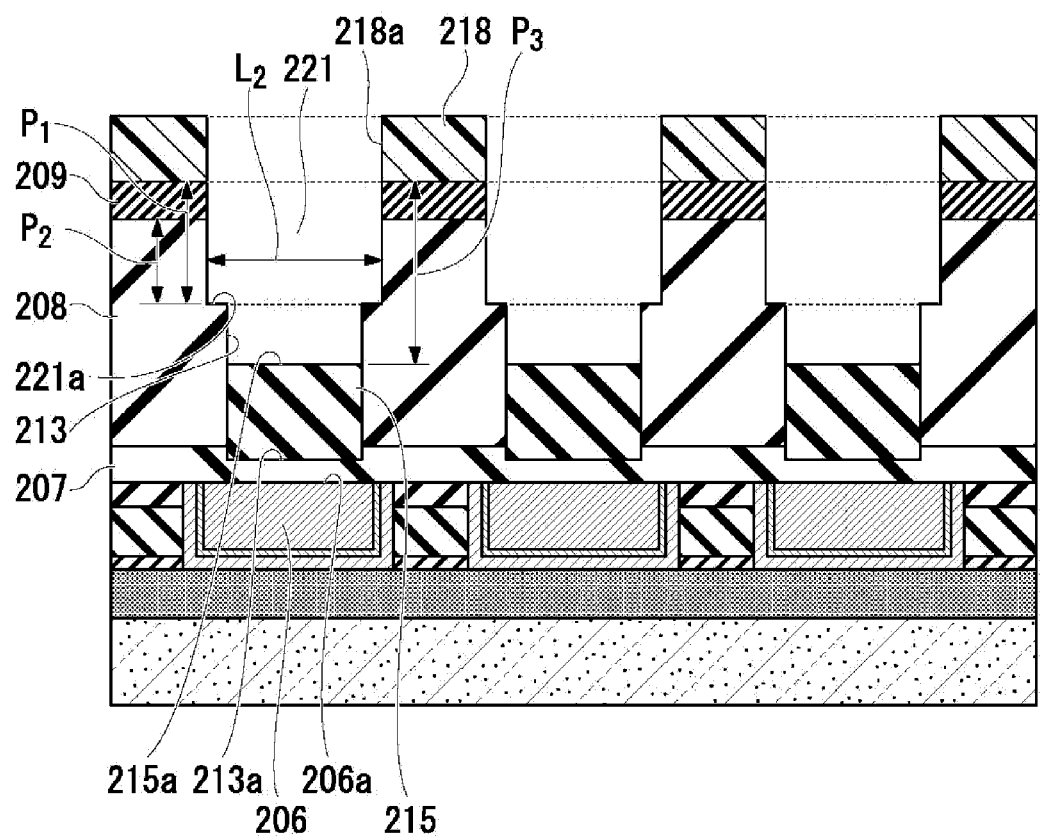
FIG. 13 is a fragmentary cross sectional elevation view of a step, subsequent to the step of FIG. 12, involved in a method of forming a semiconductor device in accordance with the related art.

Next, in the process step shown in FIG. 13, dry etching is done using the second resist mask 218 as a mask so as to etch the interlayer insulating film 208 and the protective film 209, thereby forming an interconnect formation trench 221 integrally with the hole 213.

The interconnect formation trench 221 is formed to have a width $L_2$ of 200 nm and the depth $P_1$ of 430 nm. By doing this, of the interconnect formation trench 221, the depth $P_2$ of the part that is formed on the interlayer insulating film 208 is 250 nm.

In the dry etching that is performed in the process step shown in FIG. 13, because the etching selectivity ratio of the buried insulating film 215 with respect to the interlayer insulating film 208 is approximately 1.2 to 1.4, the etching of the buried insulating film 215 proceeds more quickly than that of the interlayer insulating film 208.

The result is that, after this dry etching, the depth $P_3$ up to the upper surface 215a of the buried insulating film 215, referenced to the upper surface of the protective film 209, is approximately 580 nm. That is, the upper surface 215a of the buried insulating film 215 is disposed below the bottom surface 221a of the interconnect formation trench 221.

Thus, although a step occurs above the upper surface 215a of the buried insulating film 215, the function of the buried insulating film 215 is performed to prevent etching of the anti-diffusion film 207.

Figure 14:
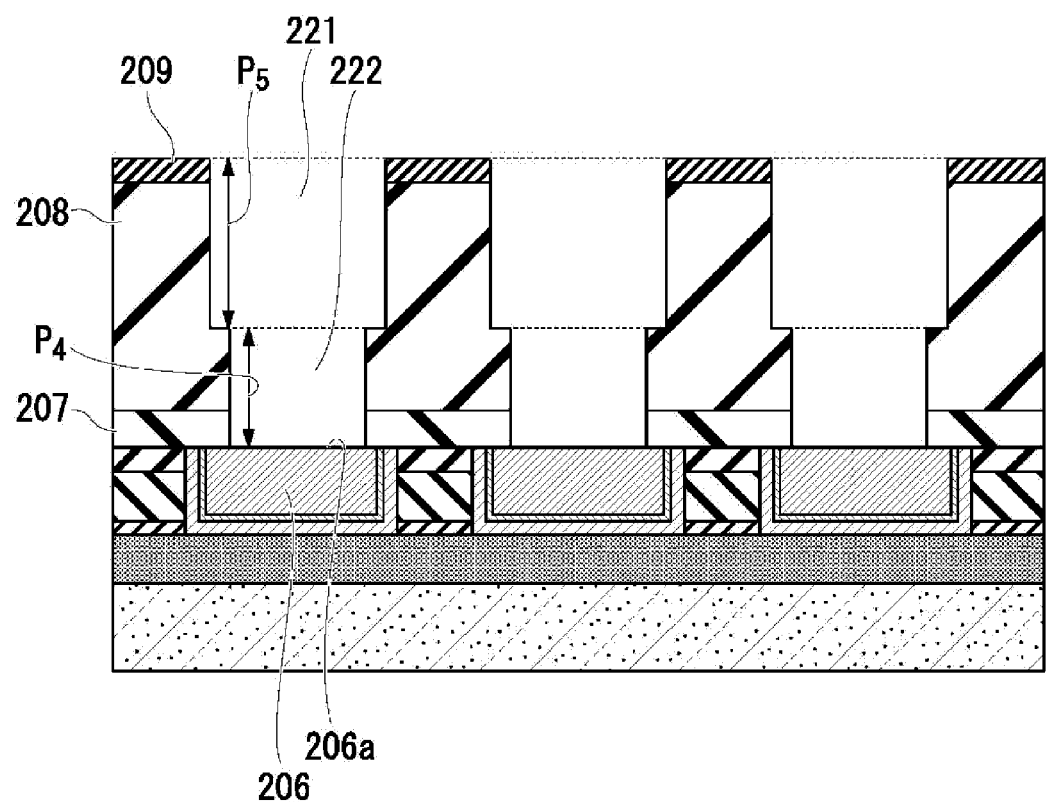
FIG. 14 is a fragmentary cross sectional elevation view of a step, subsequent to the step of FIG. 13, involved in a method of forming a semiconductor device in accordance with the related art.

Next, in the process step shown in FIG. 14, dry etching is done to remove the buried insulating film 215 remaining in the hole 213 shown in FIG. 13, and the anti-diffusion film 207 remaining between the hole 213 and the first interconnect 206, thereby forming the contact hole 222 integrally with the interconnect formation trench 221 and that exposes the upper surface 206a of the first interconnect 206.

When this is done, the depth $P_4$ of the contact hole 222 is 280 nm. Because this dry etching is done under conditions which etch an insulating film, the first interconnect 206, which is made of copper (Cu), is not etched.

Also, because the second resist mask 218 is removed during the dry etching, the protective film 209 is also slightly etched. Therefore, the depth $P_5$ of the interconnect formation trench 221 is 500 nm.

Next, the upper surface 206a of the first interconnect 206 exposed at the contact hole 222 is cleaned.

Figure 15:
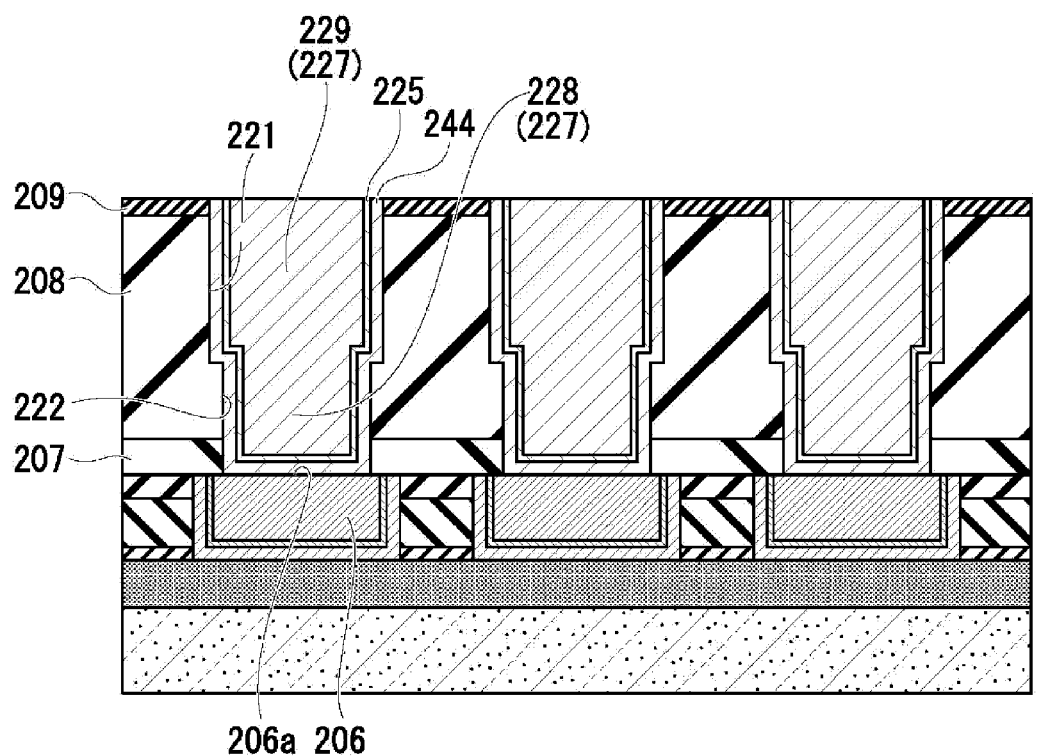
FIG. 15 is a fragmentary cross sectional elevation view of a step, subsequent to the step of FIG. 14, involved in a method of forming a semiconductor device in accordance with the related art.
Figure 16:
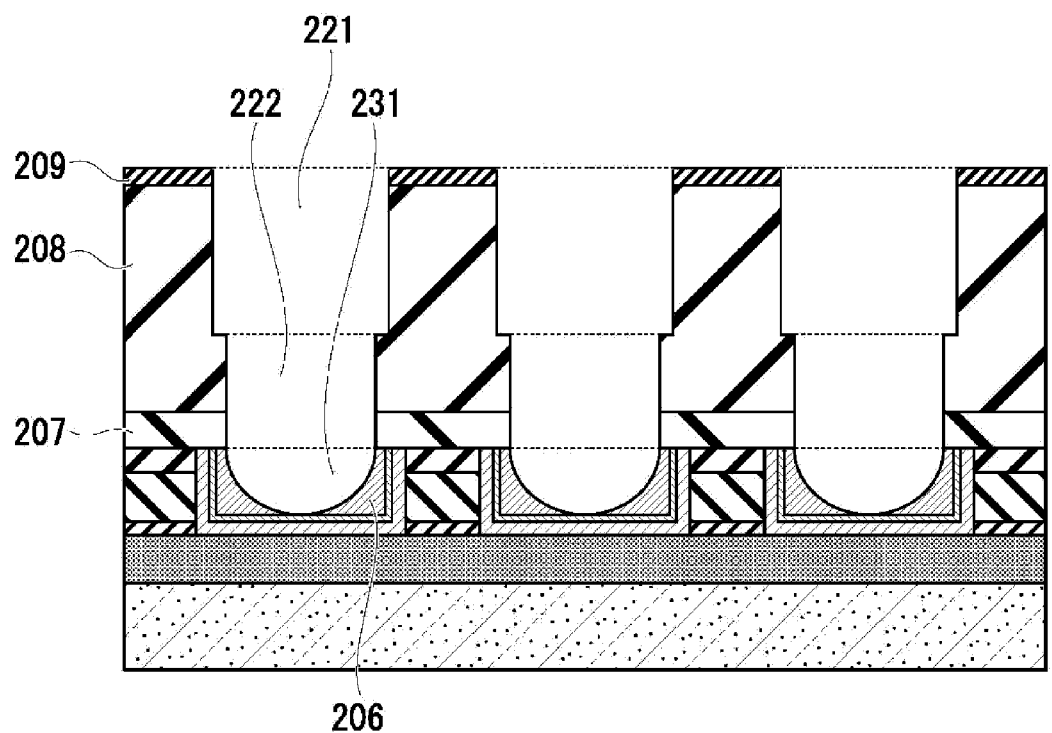
FIG. 16 is a fragmentary cross sectional elevation view of a semiconductor device formed by using the method of the related art.

Next, in the process step shown in FIG. 15, sputtering is done so as to cover the inner surfaces of the interconnect formation trench 221 and the contact hole 222, thereby sequentially depositing a tantalum film (Ta film) having a thickness of approximately 20 nm as a barrier film 224 and a copper film (Cu film) having a thickness of approximately 50 nm as a seed film 225.

Next, by the electroplating method using the seed film 225 served as a power feed layer, a copper film (Cu film) 227 is formed to a thickness (approximately 620 nm) that buries the interconnect formation trench 221 and the contact hole 222.

After that, CMP (chemical mechanical polishing) is done to polish away the excess barrier film 224, seed film 225, and copper film 227 formed further above the upper surface of the protective film 209. By doing this, a contact plug 228 and a second interconnect 229 that is electrically connected with the first interconnect 206 via the intervening contact plug 228 are simultaneously formed.

In the process step shown in FIG. 12, plasma ashing is done to remove the first resist mask 212 shown in FIG. 11, and when the film thickness of the anti-diffusion film 207 remaining below the bottom surface 213a of the hole 213 becomes thin, the oxygen that is the ashing gas causes unwanted oxidation of the copper (Cu) that constitutes the upper surface 206a of the first interconnect 206 that is the underlayer of the anti-diffusion film 207.

Oxidation occurring of the copper (Cu) that constitutes the upper surface 206a of the first interconnect 206 in this manner can be the cause of elution at the time of cleaning the upper surface 206a of the first interconnect 206 after formation of the contact hole 222.

Because the upper surface 206a of the first interconnect 206 is exposed to the cleaning liquid using the above-noted cleaning, in the process steps earlier than this, it is necessary to prevent oxidation of the copper (Cu) due to exposure and elution of the copper (Cu) due to the cleaning liquid.

That is, as shown in FIG. 16, as the number of times the oxidized copper surface is exposed to the cleaning fluid increases, elution of the copper (Cu) causes an expansion of the recess 231 formed in the first interconnect 206 and an open circuit or increased interconnect resistance in the first interconnect 206.

In particular, in the case of a method for manufacturing in which a contact hole that passes through the anti-diffusion film 207, the interlayer insulating film 208, and the protective film 209 and that also exposes the upper surface 206a of the first interconnect 206 is formed, after which the interconnect formation trench is formed, the above-noted phenomenon is prominent.

According to evaluation experiments performed by the inventor of the present invention, it was learned that, in order to avoid the above-noted phenomenon, the thickness $M_2$ of the anti-diffusion film 207 that is caused to remain at the bottom of the bottom surface 213a of the hole 213 shown in FIG. 11 needs to be set to be at least 50 nm.

However, because the dielectric constant of the silicon carbonitride film (SiCN film) that becomes the anti-diffusion film 207 is larger than that of the silicon oxide film (SiOC film) which becomes the interlayer insulating film 208, in the case of making the film thickness of the anti-diffusion film 207 large, there is an increase in the parasitic capacitance between adjacent contact plugs 228, this causing hindering high-speed operation.

For this reason, the thickness $M_2$ of the anti-diffusion film 207 that is caused to remain on the bottom surface 213a of the hole 213 is preferably as thin as possible and needs to be set to no greater than 80 nm.

In order to suppress an increase in the parasitic capacitance, it is necessary, in a condition in which the anti-diffusion film 207 is made as thin a film as possible, to perform highly precise control of the dry etching for forming the hole 213, so as to perform processing so that the anti-diffusion film 207 is left with a uniform film thickness on the bottom surface 213a of the hole 213.

However, from the standpoint of uniformity of the dry etching, it is extremely difficult to control the dry etching with high precision so as to leave a anti-diffusion film 207 with a uniform film thickness at the bottom of the bottom surface 213a of the hole 213 over the entire surface of semiconductor substrate 201.

This is caused by the fact that, because it is first necessary to form the hole 213 in the interlayer insulating film 208, which has a large film thickness, to a depth that reaches the vicinity of the upper surface 206a of the first interconnect 206, the etching time for forming the hole 213 becomes long, this accompanied by an increase in variations in the etching amount and a worsening of the uniformity over the surface of the semiconductor substrate 201.

One other cause of an increase in the variations in the etching amount is the increase the aspect ratio of the contact hole 222 accompanying a shrinking of dimensions in semiconductor devices in recent years.

Because poor uniformity over the surface in the dry etching for forming the hole 213 leads to variation is the film thickness of the anti-diffusion film 207 that remains, there ultimately occur parts over the surface of the semiconductor substrate 201 in which the anti-diffusion film 207 is not completely removed, this causing increase in the contact resistance between the first interconnects 206 and the contact plugs 228.

For this reason, in the case in which a microfine semiconductor device is manufactured using a via-first dual-damascene method in the related art, there is tendency for the manufacturing yield of the semiconductor device to decrease.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a method of forming a semiconductor device may include, but is not limited to, forming a first interlayer insulating film; forming a hole in the first interlayer insulating film; forming a second interlayer insulating film which buries the hole and covers the first interlayer insulating film; forming an interconnect groove by selectively etching the second interlayer insulating film to leave the second interlayer insulating film in the hole; and selectively removing the second interlayer insulating film in the hole.

In some cases, forming the hole may include, but is not limited to, forming a first anti-diffusion film over a first interconnect before forming the first interlayer insulating film which covers the first anti-diffusion film, the first interconnect may include, but is not limited to, a metal; forming a first hole in the first interlayer insulating film, without reaching the first hole to the first anti-diffusion film; and forming a second hole which reaches to the first anti-diffusion film by selectively etching the first interlayer insulating film directly under the first hole and by making the first hole deeper and become the second hole.

In some cases, selectively etching the first interlayer insulating film may include, but is not limited to, an etching process performed under an etching condition that the first anti-diffusion film is lower in etching rate than the first interlayer insulating film.

In some cases, the method further may include, but is not limited to, forming a contact hole under the interconnect groove by selectively removing the first anti-diffusion film under the hole. The contact hole is positioned under the hole. The contact hole exposes the first interconnect.

In some cases, the method further may include, but is not limited to, forming a conductive film which buries in the contact hole and the interconnect groove to form a contact plug in the contact hole and a second interconnect in the interconnect groove. The contact plug is coupled between the first and second interconnects.

In some cases, the second interlayer insulating film is lower in etching rate than the first interlayer insulating film.

In some cases, forming the second hole may include, but is not limited to, etching the first interlayer insulating film adjacent to at least a bottom surface and a side surface of the first hole.

In some cases, the second interlayer insulating film is formed so that the second interlayer insulating film is greater in film stress than the first interlayer insulating film.

In some cases, the contact hole is formed so that a thickness of the first interlayer insulating film is not greater two times than an opening width of the contact hole.

In some cases, the method further may include, but is not limited to, forming a first protection film which protects the first interlayer insulating film before forming the second interlayer insulating film, wherein forming the first interlayer insulating film may include, but is not limited to, forming a first low dielectric constant film, and wherein forming the first hole may include, but is not limited to, selectively etching the first interlayer insulating film and the first protection film.

In some cases, forming the first hole may include, but is not limited to, performing a first anisotropic dry etching process to selectively etch the first protection film until an upper surface of the first interlayer insulating film is exposed; and performing a second anisotropic dry etching process to selectively etch the first interlayer insulating film at a low etching selectivity of the first interlayer insulating film to the first anti-diffusion film.

In some cases, selectively removing the second interlayer insulating film in the second hole may include, but is not limited to, performing a third anisotropic dry etching process to selectively remove the first protection film exposed to the interconnect groove and to selectively removing the second interlayer insulating film in the second hole.

In some cases, the method further may include, but is not limited to, forming a second protection film which protects the second interlayer insulating film before forming the interconnect groove. Forming the second interlayer insulating film may include, but is not limited to, forming a second low dielectric constant film. Forming the interconnect groove may include, but is not limited to, selectively etching the second protection film and the second interlayer insulating film.

In some cases, the method further may include, but is not limited to, forming a photoresist mask over the second protection film, the photoresist mask being used for performing a fourth anisotropic etching to form the interconnect groove; and removing the photoresist mask by a plasma ashing process after forming the contact hole.

In some cases, the method further may include, but is not limited to, performing a cleaning process to clean an exposed upper surface of the first interconnect, after performing the plasma ashing process and before forming the contact plug and the second interconnect. The exposed upper surface is exposed to the contact hole.

In some cases, forming the first interconnect may include, but is not limited to, forming a copper interconnect.

In some cases, the method further may include, but is not limited to, forming a barrier film covering inside surfaces of the interconnect groove and the contact hole after performing the cleaning process and before forming the contact plug and the second interconnect; and forming a seed film covering the barrier film.

In some cases, forming the conductive film may include, but is not limited to, forming a metal film by an electrolyte plating method using the seed film as a feeder layer.

In some cases, forming the barrier film may include, but is not limited to, forming a tantalum film, and forming the seed film may include, but is not limited to, forming a copper film.

In some cases, forming the conductive film may include, but is not limited to, forming a copper film.

A method for manufacturing a semiconductor device according to embodiments of the present invention, of the first anti-diffusion film and the first interlayer insulating film laminated on the upper surface of the first interconnect made of metal, performs anisotropic dry etching of the first interlayer insulating film to form a first hole having a depth that does not reach the first anti-diffusion film, followed by the anisotropic dry etching under conditions at which the first anti-diffusion film is more difficult to etch than the first interlayer insulating film, the first interlayer insulating film remaining at the bottom of the first hole being selectively removed, thereby forming a second hole which has been made from the first hole. The second hole is deeper than the first hole. The second hole also exposes the first anti-diffusion film at the bottom surface. By doing this, compared with a method for manufacturing a semiconductor device in the related art in which a hole is formed by etching an interlayer insulating film, the etching amount required for using the etching processes of the embodiments of the present invention is smaller, so that it is possible to reduce the amount of etching variations by using the etching processes of the embodiments of the present invention.

After formation of the first hole, the first interlayer insulating film remaining on the bottom surface of the first hole is removed using conditions under which the first anti-diffusion film is difficult to etch so as to change the first hole into the second hole, while causing the first anti-diffusion film to remain with a sufficient thickness beneath the bottom surface of the second hole.

That is, over the surface of the semiconductor substrate, it is possible to cause the first anti-diffusion film to remain beneath the bottom surface of the second hole with a thickness that is both uniform and sufficient.

Additionally, after forming the second hole, a second interlayer insulating film having a faster etching rate than the first interlayer insulating film is formed so as to bury the second hole on the first interlayer insulating film, followed by anisotropic etching of the second interlayer insulating film until the upper surface of the first interlayer insulating film is exposed so as to form an interconnect formation trench integrally with the second hole which have been made from the first hole. This is followed by anisotropic dry etching to selectively remove the second interlayer insulating film remaining in the second hole, after which anisotropic dry etching is done to selectively remove the first anti-diffusion film at a position beneath the second hole, thereby forming a contact hole. The contact hole is positioned under the interconnect groove. The contact hole reaches the upper surface of the first interconnect. The contact hole and the interconnection groove are formed by etching processes for etching the second interlayer insulating film after the process for forming the second interlayer insulating film which covers the first inter-layer insulating film and buries the second hole. The second hole reaches the first anti-diffusion film and does not reach the upper surface of the first interconnect. The second hole had been changed from the first hole by etching the first hole which does no reach the first anti-diffusion film. The contact hole is deeper than the second hole and also that exposes the upper surface of the first interconnect. By doing this, until the process step immediately before the process step of selectively removing the first anti-diffusion film positioned beneath the second hole, the first anti-diffusion film that has a uniform and sufficient thickness remains beneath the bottom surface of the second hole, so that, for example, it is possible to suppress the oxidation of the upper surface of the first interconnect by plasma ashing to remove the photoresist mask.

Also, in the process steps from the step of forming the first hole up until before the step of forming the contact plug and the second interconnect, because the number of times the upper surface of the first interconnect is exposed can be made only one time, it is possible to suppress the oxidation of the upper part of the first interconnect.

By the above, after the formation of the contact hole, it is possible to prevent the formation of a recess in the upper part of the first interconnect by elution of metal that constitutes the upper part of the first interconnect when cleaning the upper surface of the first interconnect 25.

Thus, even in the case of a microfine semiconductor device, it is possible to suppress an increase in the contact resistance between the contact plugs and the first interconnects, thereby enabling an improvement in the yield of the semiconductor device.

Embodiments

Embodiments of the present invention will be described in detail below, with references made to the drawings. The drawings used in the following description are for the purpose of describing the constitution of the embodiments of the present invention, and the sizes, thicknesses, and dimensions and the like of the various parts shown therein may differ from the dimensional relationship in an actual semiconductor device.

FIG. 1 to FIG. 9 are cross-sectional views showing the manufacturing processing steps for a semiconductor device of an embodiment of the present invention.

Referring to FIG. 1 to FIG. 9, the method for manufacturing the semiconductor device 10 (refer to FIG. 9) according to an embodiment of the present invention will be described.

Figure 1:
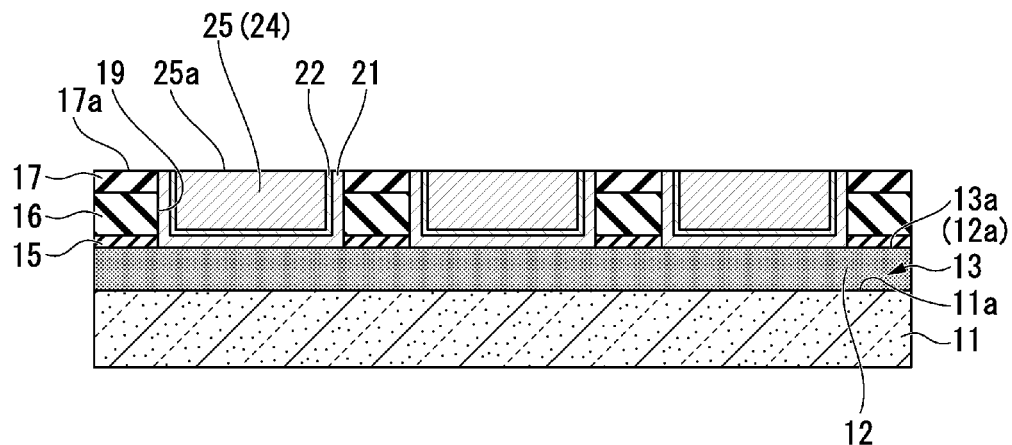
FIG. 1 is a fragmentary cross sectional elevation view of a step involved in a method of forming a semiconductor device in accordance with one embodiment of the present invention.

First, in the process step shown in FIG. 1, an element layer 13 having an element separation region (not shown), a MOS transistor (not shown), an interlayer insulating film 12, a contact plug (not shown), and an interconnect (not shown) is formed on the main surface 11a of a semiconductor substrate 11.

Specifically, a silicon substrate (silicon wafer) is prepared as the semiconductor substrate 11, and an element separation region (not shown, one of the constituent elements of the element layer 13) that partitions active regions (not shown) is formed in the semiconductor substrate 11. This element separation region is formed, for example, by STI (shallow trench isolation). It is possible to use a film laminate of a silicon oxide film ($SiO_2$ film) and a silicon nitride film ($Si_3N_4$ film) as the insulating film constituting the element separation region.

Next, an MOS (metal oxide semiconductor) transistor (not shown) is formed on the active region (not shown) using a well-known method. The MOS transistor (not shown) is constituted by a non-illustrated gate insulating film, a gate electrode, and first and second impurity diffusion regions.

A silicon oxide film ($SiO_2$ film), for example, can be used as the gate insulating film (not shown). The gate electrode (not shown) is formed by patterning a conductive film (for example, a polysilicon film (poly-Si film) or a tungsten film (W film) or the like).

The first and second impurity diffusion regions (not shown) are simultaneously formed by ion implantation into the active region of an impurity having a conductivity of a different type than that of the semiconductor substrate 11 (for example, if the semiconductor substrate 11 is a p-type silicon substrate, an n-type impurity).

A buried MOS transistor in which at least a part of the gate electrode (not shown) is buried in the semiconductor substrate 11 or a planar MOS transistor may be formed as the above-noted MOS transistor.

The interlayer insulating film 12 is formed so as to cover the non-illustrated MOS transistor. Specifically, it is formed by growing a silicon oxide film ($SiO_2$) that becomes the interlayer insulating film 12.

The interlayer insulating film 12 is formed by laminating a silicon oxide film ($SiO_2$ film).

The contact plugs and the interconnects (neither shown) are formed in the interlayer insulating film 12 so as to be provided therewithin, thereby forming the element layer 13. The upper surface 13a of the element layer 13 is also the upper surface 12a of the interlayer insulating film 12.

The contact plugs and the interconnects (neither shown) are electrically connected to the non-illustrated MOS transistor (specifically, to the first and second impurity diffusion regions (neither shown)). These contact plugs and interconnects (not shown) are electrically connected to the first interconnect 25 shown in FIG. 1. By doing this, the non-illustrated MOS transistor is electrically connected to the first interconnect 25.

Next, an anti-diffusion film 15, an interlayer insulating film 16, and a protective film 17 are sequentially formed on the upper surface 13a of the element layer 13 (upper surface 12a of the interlayer insulating film 12).

Specifically, PE-CVD (plasma-enhanced chemical vapor deposition) is used to form a silicon carbonitride film (SiCN film) with a thickness of approximately 30 nm as the anti-diffusion film 15.

Next, PE-CVD is done to form a silicon oxycarbide film (SiOC film), which is a low-K film (low dielectric constant film), as the interlayer insulating film 16. The thickness of the silicon oxycarbide film (SiOC film) is approximately 110 nm.

Next, PE-CVD is done to form a silicon oxide film ($SiO_2$ film) having a thickness of approximately 50 nm, as the protective film 17.

Next, photolithography and dry etching are used to form a trench 19 that passes through the laminated anti-diffusion film 15, the interlayer insulating film 16, and the protective film 17, and that also exposes the upper surface of the contact plug (not shown) formed in the element layer 13, which is a contact plug electrically connected to the MOS transistor (not shown).

Next, sputtering is used to deposit a barrier film 21 that covers the inner surface of the trench 19. Specifically, a tantalum film (Ta film) is deposited as the barrier film 21. When this is done, the barrier film 21 is deposited on the upper surface 17a of the protective film 17 as well.

Next, sputtering is used to deposit a seed film 22 that covers the surface of the barrier film 21. Specifically, a copper film (Cu film) is deposited as the seed film 22. By doing this, a seed film 22 is formed on the inner surface of the trench 19, with an intervening barrier film 21.

Next, electroplating with the seed film 22 as the power feed layer forms a copper film (Cu film) 24 having a thickness that buries the trench 19.

Next, CMP (chemical mechanical polishing) is done to remove, by polishing, the excess barrier film 21, seed film 22, and copper film (Cu film) 24 formed further above the upper surface 17a of the protective film 17, so as to expose the upper surface 17a of the protective film 17 and also so as to cause the barrier film 21, the seed film 22, and the copper film (Cu film) 24 to remain inside the trench 19.

By doing this, a first interconnect 25 made of a copper film (Cu film) is formed inside the trench, the upper surface 25a of which is substantially flush with the upper surface 17a of the protective film 17. That is, the first interconnect 25 is formed by the single-damascene method.

Figure 2:
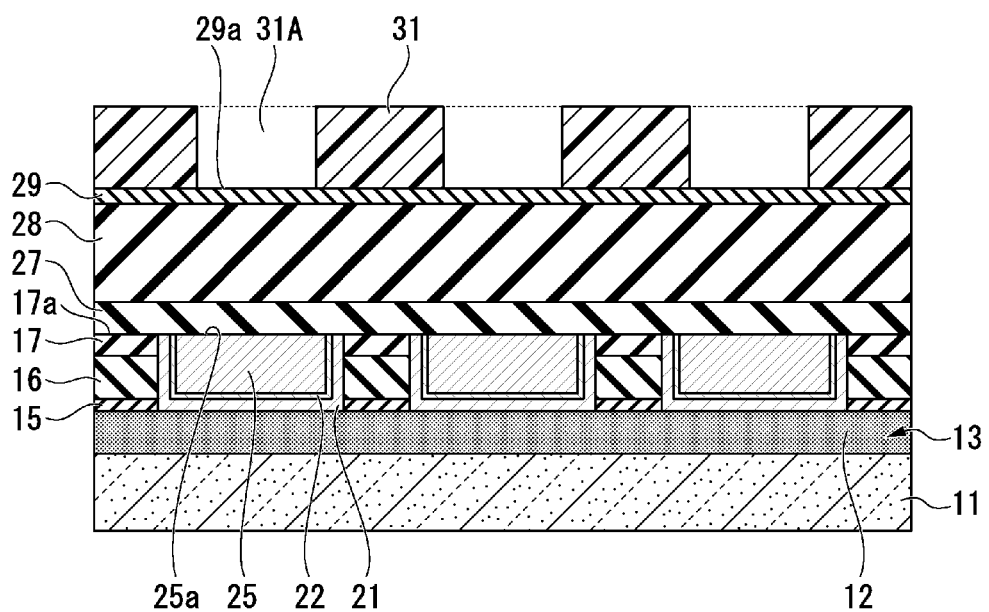
FIG. 2 is a fragmentary cross sectional elevation view of a step, subsequent to the step of FIG. 1, involved in the method of forming the semiconductor device in accordance with one embodiment of the present invention.

Next, in the process step shown in FIG. 2, a first anti-diffusion film 27, a first interlayer insulating film 28 that has a first film stress, and a first protective film 29 are sequentially formed on the upper surface 17a of the protective film 17 and the upper surface 25a of the first interconnect 25.

Specifically, PE-CVD is used to form a silicon carbonitride film (SiCN film) having a thickness of approximately 80 nm as the first anti-diffusion film 27. The first anti-diffusion film 27 is preferably set with the film thickness (80 nm in the present embodiment) that is the maximum within the allowable limit of the parasitic capacitance.

Next, PE-CVD is used to form a silicon oxycarbide film (SiOC film), which is a low-K film (low dielectric constant film) as the first interlayer insulating film 28. When this is done, the silicon oxycarbide film (SiOC film) is formed with a thickness of approximately 230 nm.

The silicon oxycarbide film (SiOC film) that becomes the first interlayer insulating film 28 can be formed with chamber in the PE-CVD apparatus at a temperature of 380° C. and a pressure of 510 Pa, and with a bias power of 2470 W, with the supply of DMDMOS (dimethyl dymethoxy silane: $Si(CH_3)_2(OCH_3)_2$) at 330 sccm (standard cubic centimeters per minute) and helium (He), which is the process gas supplied at 180 sccm, so that formation is done with a first film stress (14.7 GPa in the case of the present embodiment).

The first interlayer insulating film 28 is an interlayer insulating film that is the interlayer insulating film 208 shown in FIG. 10 that illustrates the conventional method, but made thinner. In this present embodiment, the thickness of the first interlayer insulating film 28 is reduced to approximately 40% of the thickness of the interlayer insulating film 208 shown in FIG. 10.

Figure 8:
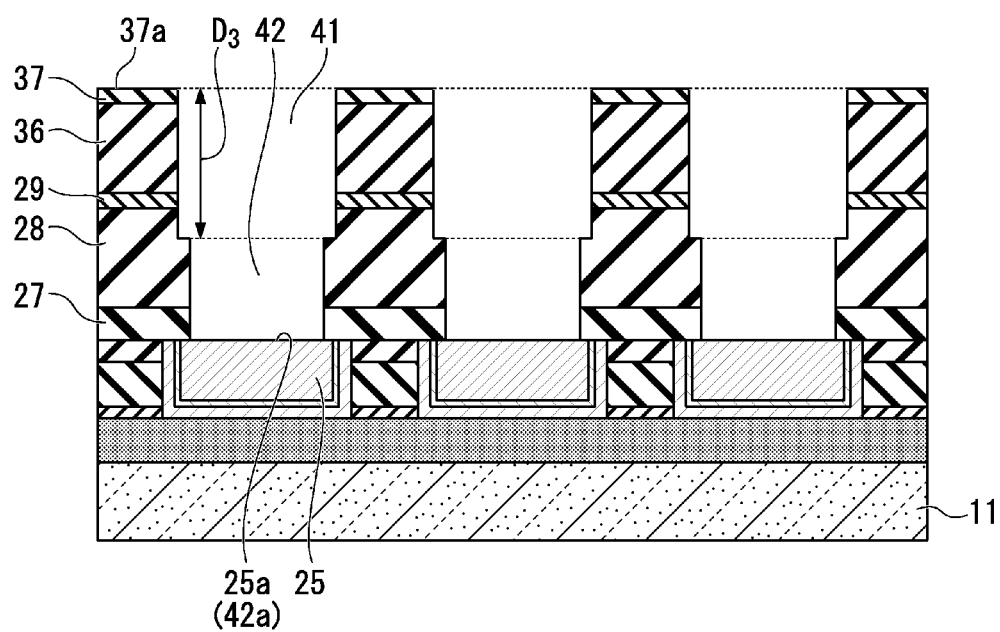
FIG. 8 is a fragmentary cross sectional elevation view of a step, subsequent to the step of FIG. 7, involved in the method of forming the semiconductor device in accordance with one embodiment of the present invention.

The first interlayer insulating film 28 is an interlayer insulating film in which a contact hole 42 shown in FIG. 8 will be formed, and the thickness of the first interlayer insulating film 28 can be made no greater than approximately two times the aperture width of the contact hole 42.

In order to clarify terms of a first hole 33, a second hole 34 and a contact hole 34, the following brief descriptions will be made prior to describing the detailed processes. As shown in FIG. 8, the contact hole 42 is positioned under an interconnect groove 41. As shown in FIG. 8, the contact hole 42 reaches the upper surface of a first interconnect 25. The contact hole 42 and the interconnection groove 41 are formed by etching processes for etching a second interlayer insulating film 36 after the process for forming the second interlayer insulating film 36 which covers a first interlayer insulating film 28 and buries a second hole 34 in the first interlayer insulating film 28. As shown in FIG. 4, the second hole 34 reaches the first anti-diffusion film 27 and does not reach the upper surface of the first interconnect 25. The second hole 34 had been formed from the first hole 33 by etching the first hole 33 which does no reach the first anti-diffusion film 27. The first hole 33 of FIG. 3 is changed by etching process into the second hole 34 shown in FIG. 4.

Figure 3:
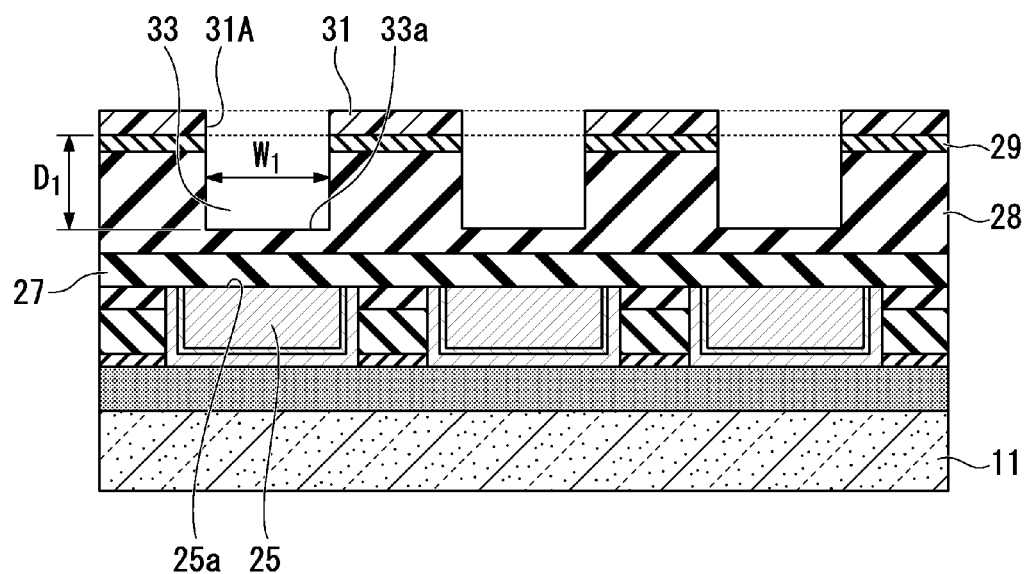
FIG. 3 is a fragmentary cross sectional elevation view of a step, subsequent to the step of FIG. 2, involved in the method of forming the semiconductor device in accordance with one embodiment of the present invention.
Figure 4:
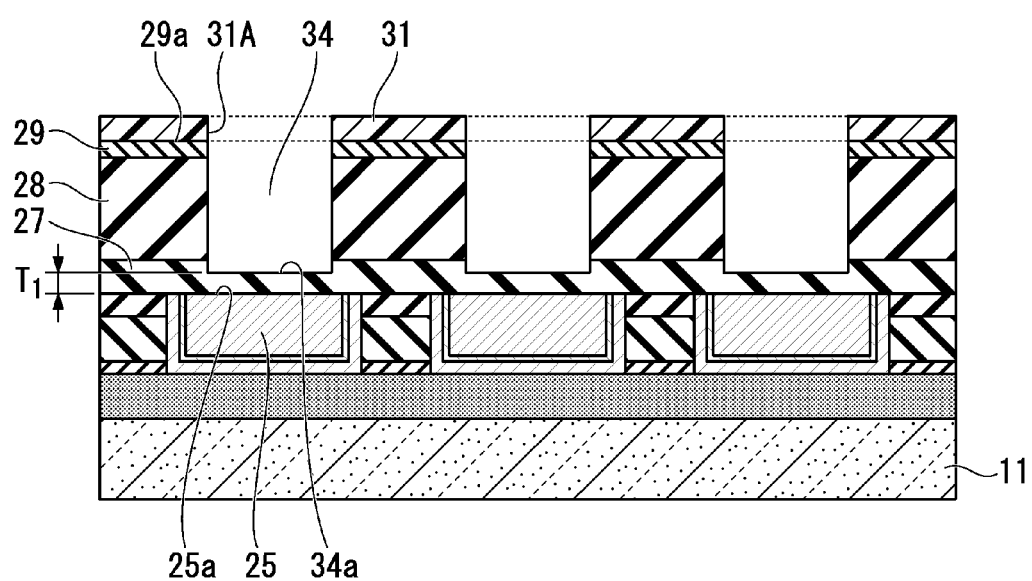
FIG. 4 is a fragmentary cross sectional elevation view of a step, subsequent to the step of FIG. 3, involved in the method of forming the semiconductor device in accordance with one embodiment of the present invention.

By reducing the thickness of the first interlayer insulating film 28 down to approximately 40% of the thickness of the interlayer insulating film 208 shown in FIG. 10 and also to less than two times the aperture width of the contact hole 42 in this manner, it is possible to facilitate the formation of the first hole 33 formed in the process step of FIG. 3, and the second hole 34 formed in the process step of FIG. 4. That is, it is possible to suppress the etching variations in the anisotropic dry etching over the surface of the semiconductor substrate 11 when forming the first and second holes 33 and 34.

By doing this, after forming the second hole 34, it is possible to cause the first anti-diffusion film 27 to remain with a sufficient thickness (specifically, a thickness of at least 50 nm) beneath the bottom surface 34a of the second hole 34. That is, in the process step shown in FIG. 4 to the process step shown in FIG. 7, plasma ashing processing or the like can be done to suppress the oxidation of the upper surface 25a side of the first interconnect 25.

Next, PE-CVD is used to form a silicon oxide film ($SiO_2$ film) having a thickness of approximately 50 nm as the first protective film 29. The first protective film 29, by covering the first interlayer insulating film 28, which is made of a silicon oxycarbide film (SiOC film) having a weak mechanical strength, prevents damage to the first interlayer insulating film 28.

Next, a first photoresist mask 31 having an aperture part 31A is formed by photolithography on the upper surface 29a of the first protective film 29. When this is done, the aperture part 31A is formed so as to expose the upper surface 29a of the first protective film 29 in a part that is opposite the region for formation of the first hole 33 shown in FIG. 3.

Next, in the process step shown in FIG. 3, anisotropic etching is done to etch the first interlayer insulating film 28 and the first protective film 29 so as to form the first hole 33 with a depth that does not reach the first anti-diffusion film 27.

Specifically, the first hole 33 is formed in two etching steps, using a planar parallel-electrode type of plasma dry etching apparatus.

In the first step, with the chamber in the dry etching apparatus at an internal pressure of 50 mTorr, the bias power to the upper electrode at 500 W, and the bias power to the lower electrode at 2500 W, under these conditions argon (Ar), which is the process gas, is supplied at 700 sccm, perfluorocyclobutane ($C_4F_8$) is supplied at 20 sccm, and oxygen ($O_2$) is supplied at 27 sccm to etch the first protective film 29.

Then, in the second step, with the chamber in the dry etching apparatus at an internal pressure of 30 mTorr, the bias power to the upper electrode at 500 W, and the bias power to the lower electrode at 2500 W, under these conditions argon (Ar), which is the process gas, is supplied at 450 sccm, perfluorocyclobutane ($C_4F_8$) is supplied at 8 sccm, oxygen ($O_2$) is supplied at 23 sccm, difluoromethane ($CH_2F_2$) is supplied at 20 sccm, and nitrogen ($N_2$) is supplied at 50 sccm to etch the first interlayer insulating film 28.

In the anisotropic dry etching in the first step, etching conditions are used at which the etching selectivity ratio of first interlayer insulating film is low with respect to the first anti-diffusion film 27 (or stated differently, etching conditions at which the first anti-diffusion film 27 is easily etched).

By doing this, it is possible to make the shape of the side wall of the first hole 33 formed in the first interlayer insulating film 28 substantially vertical.

In the above-noted second step, because etching conditions are used at which the etching selectivity ratio of the first interlayer insulating film 28 is low with respect to the first anti-diffusion film 27, in the case in which etching is done until the bottom surface 33a of the first hole 33 exposes the first anti-diffusion film 27, there is a risk that variations in etching can cause the first hole 33 to break through the first anti-diffusion film 27.

The etching of the first hole 33, therefore, is done to a depth at which the first hole 33 does not reach the first anti-diffusion film 27. The first hole 33 is formed so that the aperture width $W_1$ thereof is 180 nm, and so that the depth $D_1$ thereof is 240 nm.

Next, in the process step shown in FIG. 4, anisotropic dry etching is done under conditions at which the first anti-diffusion film 27 is more difficult to each than the first interlayer insulating film 28, thereby selectively removing the first interlayer insulating film 28 remaining beneath the first hole 33. By doing this, the first hole 33 is made into the second hole 34, which is deeper than the first hole 33 shown in FIG. 3 and the second hole 34 also exposes the first anti-diffusion film 27 at the bottom surface 34a. The second hole 34 reaches the first anti-diffusion film 27 and does not reach the upper surface of the first interconnect 25. The second hole 34 had been formed from the first hole 33 by etching the first hole 33 which does no reach the first anti-diffusion film 27. The first hole 33 of FIG. 3 is changed by etching process into the second hole 34 shown in FIG. 4.

Specifically, with the chamber in the dry etching apparatus at an internal pressure of 50 mTorr, the bias power to the upper electrode at 400 W, and the bias power to the lower electrode at 2500 W, under these conditions argon (Ar), which is the process gas, is supplied at 600 sccm, perfluorocyclobutane ($C_4F_8$) is supplied at 8 sccm, and nitrogen ($N_2$) is supplied at 440 sccm to etch the first interlayer insulating film 28 and to form the second hole 34.

By using the above-noted etching conditions, it is possible to make the etching selectivity ratio of the first interlayer insulating film 28 with respect to the first anti-diffusion film 27 (that is, the etching rate of the first interlayer insulating film 28 divided by the etching rate of the first anti-diffusion film 27) approximately 5.

In this manner, by selectively removing the first interlayer insulating film 28 remaining at the bottom of the first hole 33 using conditions under which the first anti-diffusion film 27 is difficult to etch, it is possible to cause the first anti-diffusion film 27 to remain beneath the bottom surface 34a of the second hole 34 with a sufficient thickness $T_1$ (specifically, a thickness of at least 50 nm) over the surface of the semiconductor device 11.

Figure 5:
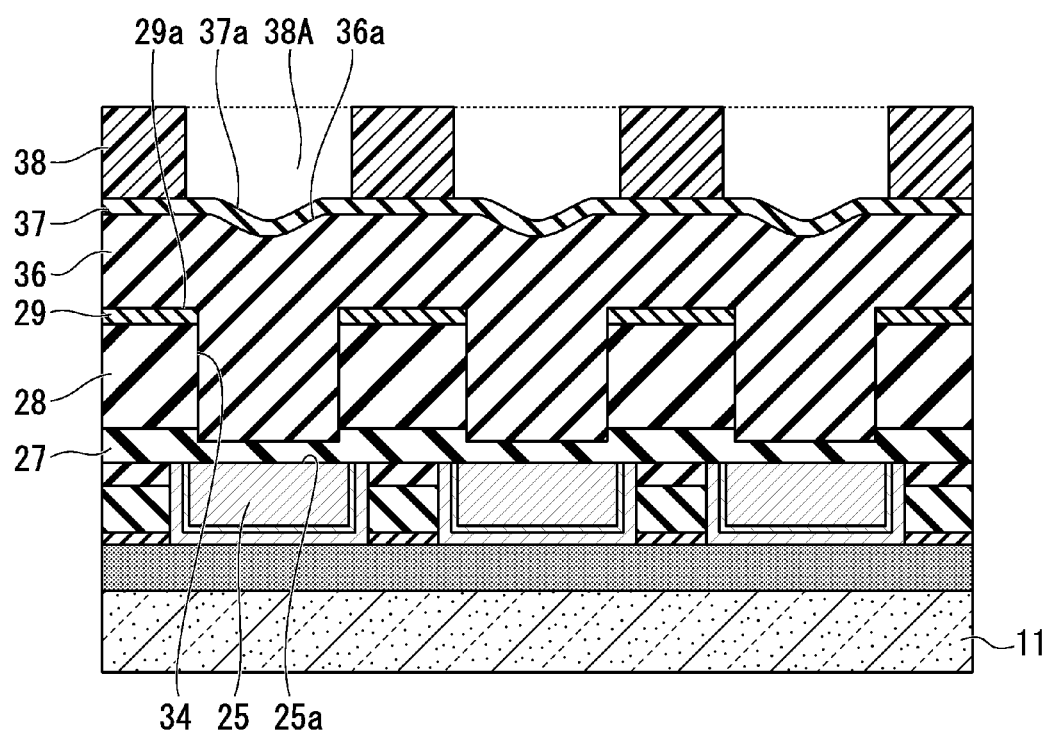
FIG. 5 is a fragmentary cross sectional elevation view of a step, subsequent to the step of FIG. 4, involved in the method of forming the semiconductor device in accordance with one embodiment of the present invention.

Next, in the process step shown in FIG. 5, plasma ashing is done to remove the first photoresist mask 31 shown in FIG. 4, thereby exposing the upper surface 29a of the first protective film 29.

Next, a second interlayer insulating film 36 having an etching rate that is faster than that of the first interlayer insulating film 28 is formed on the upper surface 29a of the first protective film 29 so as to bury the second hole 34.

Specifically, PE-CVD is done so as to form a silicon oxycarbide film (SiOC film), which is a low-K film (low dielectric constant film), as the second interlayer insulating film 36. The thickness of the silicon oxycarbide film (SiOC film) is approximately 370 nm.

The silicon oxycarbide film (SiOC film) that becomes the second interlayer insulating film 36 is an interlayer insulating film that has a dielectric constant that is the same as that of the first interlayer insulating film 28.

The silicon oxycarbide film (SiOC film) that becomes the second interlayer insulating film 36 can be formed with the chamber in a dry etching apparatus at a temperature of 380° C. and a pressure of 420 Pa, with a bias power of 3550 W, and with the supply of DMDMOS ($Si(CH_3)_2(OCH_3)_2$) at 330 sccm, which is the process gas, and with the supply of helium (He), which is the process gas, at 180 sccm, so that formation is done with a second film stress (19.1 GPa in the case of the present embodiment) that is greater than the first film stress of the first interlayer insulating film 28 (14.7 GPa in the case of the present embodiment).

By making the second film stress of the second interlayer insulating film 36 greater than that of the first interlayer insulating film 28 in this manner, it is possible to make the etching rate of the second interlayer insulating film 36 faster than that of the first interlayer insulating film 28. In the case of the present embodiment, it is possible to make the etching rate of the second interlayer insulating film 36 approximately two times the etching rate of the first interlayer insulating film 28.

Next, a second protective film 37 that covers the upper surface 36a of the second interlayer insulating film 36 is formed. Specifically, a silicon oxide film ($SiO_2$ film) having a thickness of approximately 50 nm is formed as the second protective film 37 by using PE-CVD. The second protective film 37 is an insulating film for the purpose of preventing damage to the second interlayer insulating film 36 by covering the second interlayer insulating film 36, which is made of a silicon oxycarbide film (SiOC film) having a weak mechanical strength.

Next, photolithography is used to form a second photoresist mask 38 having an aperture part 38A on the second protective film 37. When this is done, the aperture part 38A is formed so as to expose a part of the upper surface 37a of the second protective film 37 that is opposite the region for formation of the interconnect formation trench 41 shown in FIG. 6 and which will be described later.

Figure 6:
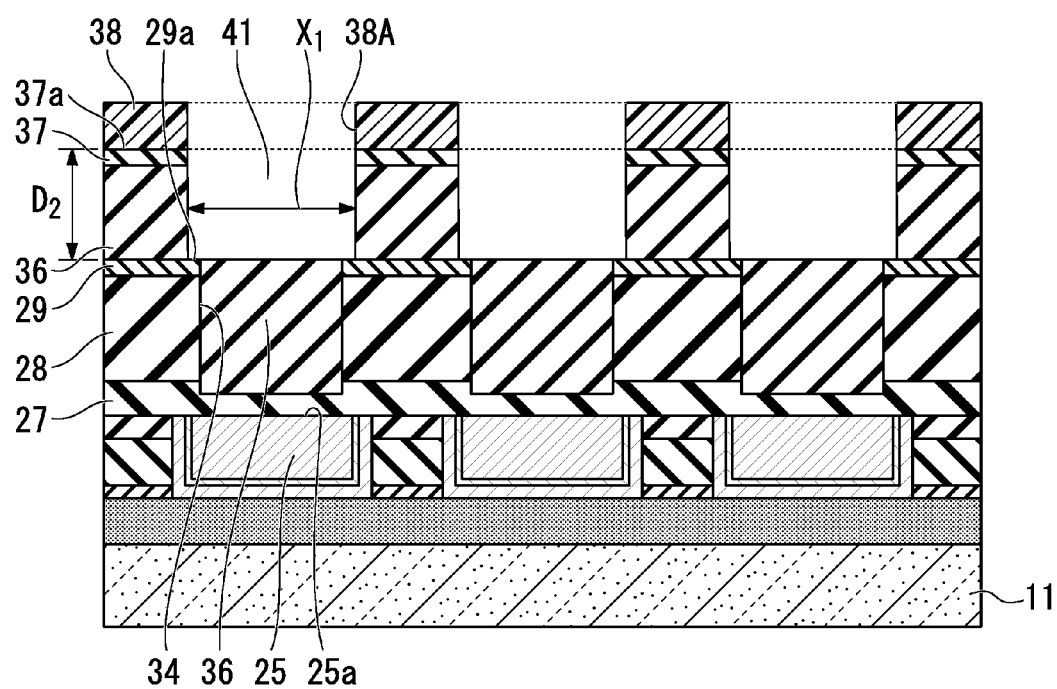
FIG. 6 is a fragmentary cross sectional elevation view of a step, subsequent to the step of FIG. 5, involved in the method of forming the semiconductor device in accordance with one embodiment of the present invention.

Next, in the process step shown in FIG. 6, by anisotropic drying etching via an interposing second photoresist mask 38, the second interlayer insulating film 36 is etched until the upper surface 29a of the first protective film 29 is exposed, so as to form an interconnect formation trench 41 that is made integrally with the second hole 34.

Specifically, with the chamber in the dry etching apparatus at an internal pressure of 125 mTorr, the bias power to the upper electrode at 1,000 W, and the bias power to the lower electrode at 500 W, under these conditions tetrafluoromethane ($CF_4$), which is the process gas, is supplied at 300 sccm, and trifluoromethane ($CHF_3$) is supplied at 150 sccm to etch the second interlayer insulating film 36. By doing this, the second interlayer insulating film 36 remains within the second hole 34.

The interconnect formation trench 41 is formed so that the width $X_1$ is approximately 200 nm, and so that the depth $D_2$ (depth from the upper surface 37a of the second protective film 37 to the upper surface 29a of the first protective film 29) is approximately 420 nm.

Figure 7:
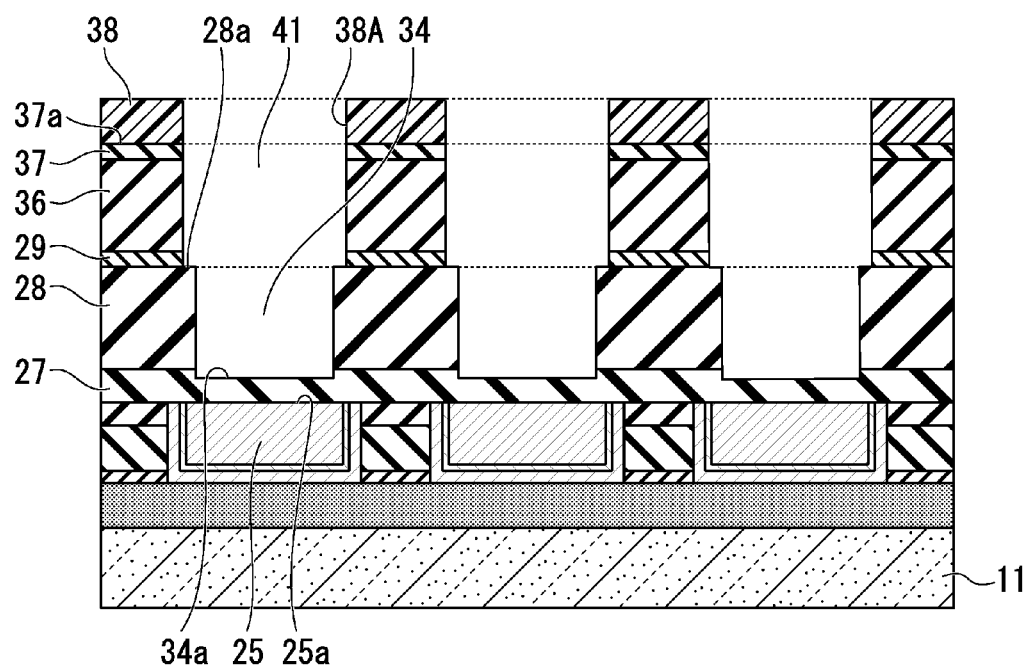
FIG. 7 is a fragmentary cross sectional elevation view of a step, subsequent to the step of FIG. 6, involved in the method of forming the semiconductor device in accordance with one embodiment of the present invention.

Next, in the process step shown in FIG. 7, by anisotropic drying etching the second interlayer insulating film 36 that remains within the second hole 34 shown in FIG. 6 is selectively removed, and also the first protective film 29 that is exposed by the interconnect formation trench 41 as shown in FIG. 6 is selectively removed. By doing this, the lower surface 34a of the second hole 34a and the upper surface 28a of the first interlayer insulating film 28 are exposed.

The anisotropic drying etching performed in the process step shown in FIG. 7 uses the same conditions as the conditions for anisotropic drying etching of the second interlayer insulating film 36 and the second protective film 37, which is done in the step shown in FIG. 6. When doing this, the etching rate varies depending on the film stress of the interlayer insulating film.

In the present embodiment, the etching of the second interlayer insulating film 25 that has greater second film stress than the first film stress of the first interlayer insulating film 28 progresses faster than the etching of the first interlayer insulating film 28.

By doing this, after removing the first protective film 29 that constitutes the part of the bottom surface of the interconnect formation trench 41 shown in FIG. 6, it is possible to selectively remove the second interlayer insulating film 36 that remains in the second hole 34.

Next, in the process step as shown in FIG. 8, the first anti-diffusion film 27 that remains beneath the second hole 34 shown in FIG. 7 is selectively removed by anisotropic drying etching, thereby forming a contact hole 42, which is deeper than the second hole 34 and which also exposes the upper surface 25a of the first interconnect 25.

As shown in FIG. 8, the contact hole 42 is positioned under an interconnect groove 41. The contact hole 42 reaches the upper surface of the first interconnect 25. The contact hole 42 is formed by etching processes for etching the second interlayer insulating film 36 after the process for forming the second interlayer insulating film 36 which covers the first interlayer insulating film 28 and buries the second hole 34 in the first interlayer insulating film 28.

Specifically, with the chamber in the dry etching apparatus at an internal pressure of 50 mTorr, the bias power to the upper electrode at 200 W, and the bias power to the lower electrode at 300 W, under these conditions tetrafluoromethane ($CF_4$), which is the process gas, is supplied at 175 sccm, and nitrogen ($N_2$) is supplied at 50 sccm to remove the remaining first anti-diffusion film 27.

When doing this, the first interlayer insulating film 28 that constitutes the bottom surface of the interconnect formation trench 41 shown in FIG. 7 is etched approximately 30 nm. By doing this, the depth $D_3$ of the interconnect formation trench 41 shown in FIG. 8 (depth referenced to the upper surface 37a of the second protective film 37) is 500 nm. Therefore, the depth $D_3$ of the interconnect formation trench 41 is substantially equal to the depth $P_5$ of the conventional interconnect formation trench 221 shown in FIG. 14, which has been described earlier.

In the present invention, at the time immediately after the process step as shown in FIG. 7, the width of the first interlayer insulating film 28 is set so the depth of the contact hole 42 is optimized.

Next, plasma ashing is done to remove the second photoresist mask 38 that remains after forming the contact hole 42.

Next, the upper surface 25a of the first interconnect 25 exposed by the contact hole 42 is cleaned. Specifically, using a liquid mixture (etching liquid) at approximately 25° C., such as dimethylsulfoxide (($CH_3$)$_2$SO), ammonium fluoride ($NH_4F$) or hydrofluoric acid (HF) and the like, the upper surface 25a of the first interconnect 25 is cleaned.

According to the present invention, in the process steps from the step shown in FIG. 3 described previously up until before the step of forming the contact plug 47 and the second interconnect 48, which will be described later shown in FIG. 4, because the number of times the upper surface 25a of the first interconnect 25 that is exposed can be made only one time, it is possible to suppress the oxidation of the upper part of the first interconnect 25.

By the above, after the step of cleaning the upper surface 25a of the first interconnect 25, because elution of copper (Cu) that constitutes the first interconnect 25 is suppressed, it is possible to suppress the formation of a recess in the upper part of the first interconnect 25.

Figure 9:
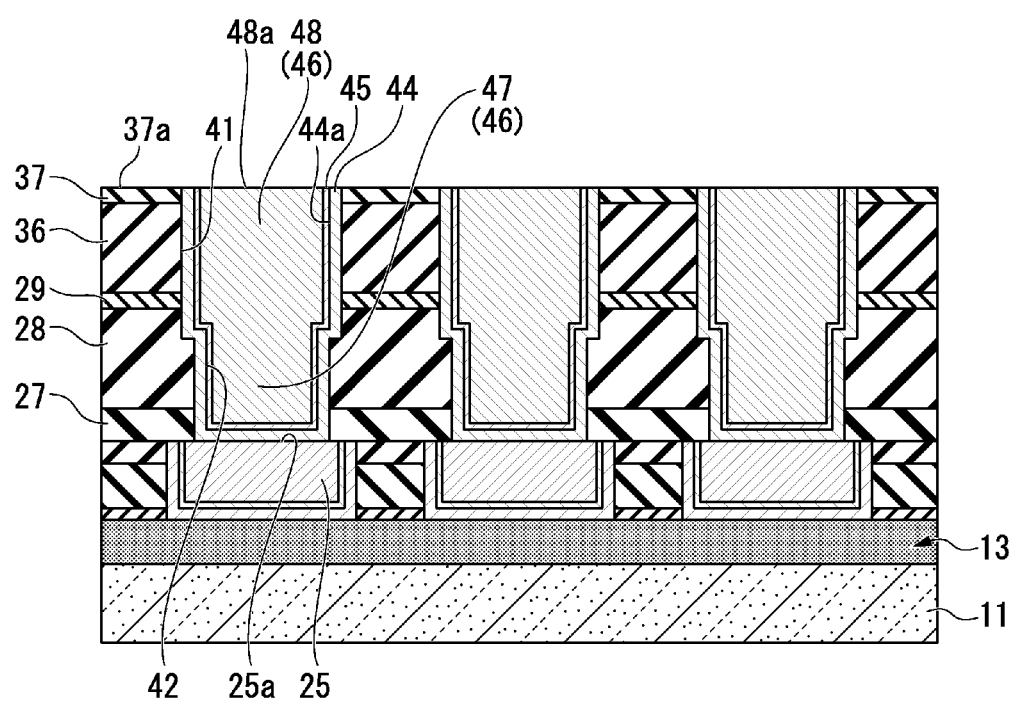
FIG. 9 is a fragmentary cross sectional elevation view of a step, subsequent to the step of FIG. 8, involved in the method of forming the semiconductor device in accordance with one embodiment of the present invention.

Next, in the process step shown in FIG. 9, the inner surface of the contact hole 42 (including the upper surface 25a of the first interconnect 25 exposing the contact hole 42), and a barrier film 44 that covers the inner surface of the interconnect formation trench 41 are formed. Specifically, a tantalum film (Ta film) with a thickness of approximately 20 nm is formed as the barrier film 44 by sputtering.

Next, a seed film 45 that covers the surface 44a of the barrier film 44 is formed. Specifically, sputtering is done so as to form a copper film (Cu film) having a thickness of approximately 50 nm as the seed film 45.

Next, by electroplating method using the seed film 45 served as a power feed layer, a copper film (Cu film) 46 is formed to a thickness (approximately 620 nm) that buries the interconnect formation trench 41 and the contact plug 42.

Next, CMP is done to polish away the excess barrier film 44, seed film 45, and copper film (Cu film) 46 formed further above the upper surface 37a of the second protective film 37, thereby causing the upper surface 37a of the second protective film 37 to be exposed and also the barrier film 44, seed film 45 and copper film (Cu film) 46 to remain only inside the interconnect formation trench 41 and contact plug 42.

By doing this, a contact plug 47 that is electrically connected with the upper surface 25a of the first interconnect 25 and that is made of a copper film 46 (Cu film) is formed within the contact hole 42, and also the second interconnect 48 that is made integrally with the contact plug 47 and that is made of a copper film 46 (Cu film) is formed in the interconnect formation trench 41, the upper surface 48a of which is substantially flush with the upper surface 37a of the second protective film 37.

That is, the contact plug 47 and the second interconnect 48 are formed simultaneously by the dual-damascene method. By doing this, the semiconductor device 10 of the present embodiment is manufactured.

The second interconnect 48 is electrically connected to a MOS transistor (not shown) that is formed on the element layer 13, via the contact plug 47 and the first interconnect 25.

A method for manufacturing a semiconductor device according to the embodiments of the present embodiment, of the first anti-diffusion film 27 and the first interlayer insulating film 28 laminated on the upper surface 25a of the first interconnect 25 made of Cu (copper), performs anisotropic dry etching of the first interlayer insulating film 28 to form a first hole 33 having a depth that does not reach the first anti-diffusion film 27, followed by the anisotropic dry etching under conditions at which the first anti-diffusion film 27 is more difficult to etch than the first interlayer insulating film 28, the first interlayer insulating film 28 remaining at the bottom of the first hole 33 being selectively removed, thereby forming a second hole 34 (a part of the contact hole 42) that is deeper than the first hole 33 and that also exposes the first anti-diffusion film 27 to the bottom surface 34a. By doing this, compared with a method for manufacturing a semiconductor device in the related art in which a hole is formed by etching an interlayer insulating film, the etching amount required for formation of the first and the second holes 33, 34 is smaller, so that it is possible to reduce the amount of etching variations when the first and second holes 33, 34 are formed in the inner surface of the semiconductor substrate 11.

After formation of the first hole, the first interlayer insulating film 28 remaining on the bottom surface of the first hole is removed using conditions under which the first anti-diffusion film is more difficult to etch than the first interlayer film 28 so as to form the second hole 34, thereby enabling causing the first anti-diffusion film 27 to remain with a sufficient thickness (specifically at least 50 nm) beneath the bottom surface 34a of the second hole 34.

That is, over the surface of the semiconductor substrate 11, it is possible to cause the first anti-diffusion film 27 to remain beneath the bottom surface 34a of the second hole 34 with a thickness that is both uniform and sufficient.

Additionally, after forming the second hole 34, a second interlayer insulating film 36 having a faster etching rate than the first interlayer insulating film 28 is formed so as to bury the second hole on above the first interlayer insulating film 28, followed by anisotropic etching of the second interlayer insulating film 36 until the upper surface of the first interlayer insulating film 28 is exposed so as to form an interconnect formation trench 41 integrally with the second hole 34, this being followed by anisotropic dry etching to selectively remove the second interlayer insulating film 36 remaining in the second hole 34, after which anisotropic dry etching is done to selectively remove the first anti-diffusion film 27 at a position beneath the second hole 34, thereby forming a contact hole 42 that is deeper than the second hole 34 and also that exposes the upper surface 25a of the first interconnect 25. By doing this, until the process step immediately before the process step of selectively removing the first anti-diffusion film 27 positioned beneath the second hole 34, the first anti-diffusion film 27 that has a uniform and sufficient thickness (specifically at least 50 nm) remains beneath the bottom surface 34a of the second hole 34, so that, for example, it is possible to suppress the oxidation of the upper surface 25a of the first interconnect 25 by plasma ashing to remove the photoresist mask.

Also, in the process steps from the step of forming the first hole 33 shown in FIG. 3 up until before the step of forming the contact plug 47 and the second interconnect 48 shown in FIG. 9, because the number of times the upper surface 25a of the first interconnect 25 is exposed can be made only one time, it is possible to suppress the oxidation of the upper part of the first interconnect 25.

By the above, after the formation of the contact hole 42, it is possible to prevent the formation of a recess in the upper part of the first interconnect 25 by elution of the Cu that constitutes the upper part of the first interconnect 25 when cleaning the upper surface 25a of the first interconnect 25.

Thus, even in the case of a microfine semiconductor device 10, it is possible to suppress an increase in the contact resistance between the contact plugs 47 and the first interconnects 25, thereby enabling an improvement in the yield of the semiconductor device 10.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
   forming a first interlayer insulating film;
   forming a hole in the first interlayer insulating film;
   forming a second interlayer insulating film which buries the hole and covers the first interlayer insulating film;
   forming an interconnect groove by selectively etching the second interlayer insulating film to leave the second interlayer insulating film in the hole so that the second interlayer insulating film remains over the first interlayer insulating film; and
   selectively removing the second interlayer insulating film in the hole,
   wherein the second interlayer insulating film is formed so that the second interlayer insulating film is different in etching rate from the first interlayer insulating film, and
   wherein each of the first and second interlayer insulating films comprises a silicon-oxycarbide film.

2. The method according to claim 1, wherein forming the hole comprises:
   forming a first anti-diffusion film over a first interconnect before forming the first interlayer insulating film which covers the first anti-diffusion film, the first interconnect comprising a metal;
   forming a first hole in the first interlayer insulating film, without reaching the first hole to the first anti-diffusion film; and
   forming a second hole which reaches to the first anti-diffusion film by selectively etching the first interlayer insulating film directly under the first hole and by making the first hole deeper and become the second hole.

3. The method according to claim 2, wherein selectively etching the first interlayer insulating film comprises an etching process performed under an etching condition that the first anti-diffusion film is lower in etching rate than the first interlayer insulating film.

4. The method according to claim 2, further comprising:
   forming a contact hole under the interconnect groove by selectively removing the first anti-diffusion film under the hole, the contact hole being positioned under the hole, the contact hole exposing the first interconnect.

5. The method according to claim 4, further comprising:
   forming a conductive film which buries in the contact hole and the interconnect groove to form a contact plug in the contact hole and a second interconnect in the interconnect groove, the contact plug being coupled between the first and second interconnects.

6. The method according to claim 1, wherein the second interlayer insulating film is higher in etching rate than the first interlayer insulating film.

7. The method according to claim 1, wherein the second interlayer insulating film is formed so that the second interlayer insulating film is greater in film stress than the first interlayer insulating film.

8. The method according to claim 4, wherein the contact hole is formed so that a thickness of the first interlayer insulating film is not greater two times than an opening width of the contact hole.

9. The method according to claim 2, further comprising:
   forming a first protection film which protects the first interlayer insulating film before forming the second interlayer insulating film,
   wherein forming the first interlayer insulating film comprises forming a first low dielectric constant film, and
   wherein forming the first hole comprises selectively etching the first interlayer insulating film and the first protection film.

10. The method according to claim 9, wherein forming the first hole comprises:
    performing a first anisotropic dry etching process to selectively etch the first protection film until an upper surface of the first interlayer insulating film is exposed; and
    performing a second anisotropic dry etching process to selectively etch the first interlayer insulating film at a low etching selectivity of the first interlayer insulating film to the first anti-diffusion film.

11. The method according to claim 9, wherein selectively removing the second interlayer insulating film in the second hole comprises:

performing a third anisotropic dry etching process to selectively remove the first protection film exposed to the interconnect groove and to selectively removing the second interlayer insulating film in the second hole.

12. The method according to claim 4, further comprising:
forming a second protection film which protects the second interlayer insulating film before forming the interconnect groove,
wherein forming the second interlayer insulating film comprises forming a second low dielectric constant film, and
wherein forming the interconnect groove comprises selectively etching the second protection film and the second interlayer insulating film.

13. The method according to claim 12, further comprising:
forming a photoresist mask over the second protection film, the photoresist mask being used for performing a fourth anisotropic etching to form the interconnect groove; and
removing the photoresist mask by a plasma ashing process after forming the contact hole.

14. The method according to claim 13, further comprising:
performing a cleaning process to clean an exposed upper surface of the first interconnect, after performing the plasma ashing process and before forming the contact plug and the second interconnect, the exposed upper surface being exposed to the contact hole.

15. The method according to claim 2, wherein forming the first interconnect comprises forming a copper interconnect.

16. The method according to claim 14, further comprising:
forming a tantalum barrier film covering inside surfaces of the interconnect groove and the contact hole after performing the cleaning process and before forming the contact plug and the second interconnect; and
forming a copper seed film covering the barrier film.

17. The method according to claim 5, wherein forming the conductive film comprises:
forming a metal film by an electrolyte plating method using a seed film as a feeder layer; and
forming a copper film.

18. The method according to claim 1, wherein forming the forming the interconnect groove by selectively etching the second interlayer insulating film comprises:
forming a photoresist mask over the second interlayer insulating film before forming the interconnect groove; and
etching the second interlayer insulating film using the photoresist mask so that a width of the groove being larger than a width of the hole, and the second interlayer insulating film remains between the first interlayer insulating layer and the photoresist mask.

19. A method of forming a semiconductor device, the method comprising:
forming a first interconnect layer in a first interlayer insulating film.
forming a first anti-diffusion film over the first interconnect layer and the first interlayer insulating film;
forming a second interlayer insulating film over the first anti-diffusion film, the second interlayer insulating film including a silicon-oxycarbide;
forming a first hole in the second interlayer insulating film so that a part of the first anti-diffusion film remains at a bottom of the first hole;
forming a third interlayer insulating film over the second interlayer insulating film and the first ant- diffusion film in the first hole, the third interlayer insulating film including a silicon-oxycarbide;
forming an interconnect groove by selectively etching the third interlayer insulating film over the second interlayer insulating film and over the first anti-diffusion film using a photoresist mask over the third interlayer insulating film;
selectively removing the third interlayer insulating film in the first hole;
selectively removing the part of first anti-diffusion film in the first hole;
removing the photoresist mask over the third interlayer insulating film; and
forming a second interconnect layer in the first hole and in the interconnect groove to connect the first interconnect layer,
wherein forming the interconnect groove comprises:
a part of the third interlayer insulating film over the second interlayer insulating film remains under the photoresist mask;
another part of the third interlayer insulating film remains in the first hole; and
a width of the interconnect groove is larger than a width of the first hole.

20. The method according to claim 19, wherein the third interlayer insulating film includes a greater film stress than that of the second interlayer insulating film.

* * * * *